(12) United States Patent
Kuenemund et al.

(10) Patent No.: US 10,418,996 B2
(45) Date of Patent: Sep. 17, 2019

(54) CIRCUIT AND METHOD FOR CHECKING THE INTEGRITY OF A CONTROL SIGNAL

(71) Applicant: Infineon Technologies AG, Neubiberg (DE)

(72) Inventors: Thomas Kuenemund, Munich (DE); Molka Ben Romdhane, Munich (DE); Berndt Gammel, Markt-Schwaben (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/718,033

(22) Filed: Sep. 28, 2017

(65) Prior Publication Data
US 2018/0091149 A1    Mar. 29, 2018

(30) Foreign Application Priority Data
Sep. 29, 2016    (DE) .................. 10 2016 118 534

(51) Int. Cl.
*H03K 19/007*    (2006.01)
*H03K 3/3562*    (2006.01)

(52) U.S. Cl.
CPC ......... *H03K 19/007* (2013.01); *H03K 3/3562* (2013.01)

(58) Field of Classification Search
CPC ... H03K 19/007; H03K 19/0075; H03K 19/00
USPC ........................................................ 327/108
See application file for complete search history.

(56) References Cited

U.S. PATENT DOCUMENTS

| 7,969,763 | B2 | 6/2011 | Kunemund |
| 7,999,559 | B2 | 8/2011 | Kuenemund |
| 8,156,251 | B1 | 4/2012 | Sorensen et al. |
| 2005/0235179 | A1* | 10/2005 | Pistoulet .......... G01R 31/31719 714/724 |
| 2007/0168848 | A1 | 7/2007 | Tschanz et al. |
| 2008/0208497 | A1* | 8/2008 | Bancel ............. G06K 19/07363 702/79 |
| 2009/0315603 | A1* | 12/2009 | Bancel .................. G06F 21/755 327/202 |
| 2016/0028394 | A1* | 1/2016 | Tasher ................. H03K 19/003 326/8 |

OTHER PUBLICATIONS

Unknown, "Flip-flop (electronics)", Wikipedia, The Free Encyclopedia, Sep. 23, 2016, https://en.wikipedia.org/wiki/Flip-flop_(electronics)?oldid=740800751, retrieved on Jul. 4, 2017.

* cited by examiner

*Primary Examiner* — Patrick C Chen
(74) *Attorney, Agent, or Firm* — Viering, Jentschura & Partner MBB

(57) ABSTRACT

According to an embodiment, a circuit is described comprising a plurality of flip-flops, a control circuit configured to provide a control signal to each flip-flop of the plurality of flip-flops and an integrity checking circuit connected to the control circuit and to the plurality of flip-flops configured to check whether the flip-flops receive the control signal as provided by the control circuit.

20 Claims, 14 Drawing Sheets

CIRCUIT AND METHOD FOR CHECKING THE INTEGRITY OF A CONTROL SIGNAL

CROSS-REFERENCE TO RELATED APPLICATION

This application claims priority to German Patent Application Serial No. 10 2016 118 534.5, which was filed Sep. 29, 2016, and is incorporated herein by reference in its entirety.

TECHNICAL FIELD

The present disclosure relates to circuits and methods for checking the integrity of a control signal.

BACKGROUND

An integrated circuit may be subject to an attack by an attacker who wants to change the behavior of the integrated circuit, e.g. to gain access to confidential information. One sort of attacks are force attacks on data storage elements like flip-flops, e.g. attacks on a reset signal or a scan test signal supplied to a plurality of flip-flops. Accordingly, approaches to detect such attacks in an integrated circuit are desirable.

SUMMARY

According to an embodiment, a circuit is provided including a plurality of flip-flops, a control circuit configured to provide a control signal to each flip-flop of the plurality of flip-flops and an integrity checking circuit connected to the control circuit and to the plurality of flip-flops configured to check whether the flip-flops receive the control signal as provided by the control circuit.

According to a further embodiment, a method for checking the integrity of a control signal according to the circuit described above is provided.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. In the following description, various aspects are described with reference to the following drawings, in which.

DETAILED DESCRIPTION

The following detailed description refers to the accompanying drawings that show, by way of illustration, specific details and aspects of this disclosure in which the present disclosure may be practiced. Other aspects may be utilized and structural, logical, and electrical changes may be made without departing from the scope of the present disclosure. The various aspects of this disclosure are not necessarily mutually exclusive, as some aspects of this disclosure can be combined with one or more other aspects of this disclosure to form new aspects.

Figure 1:
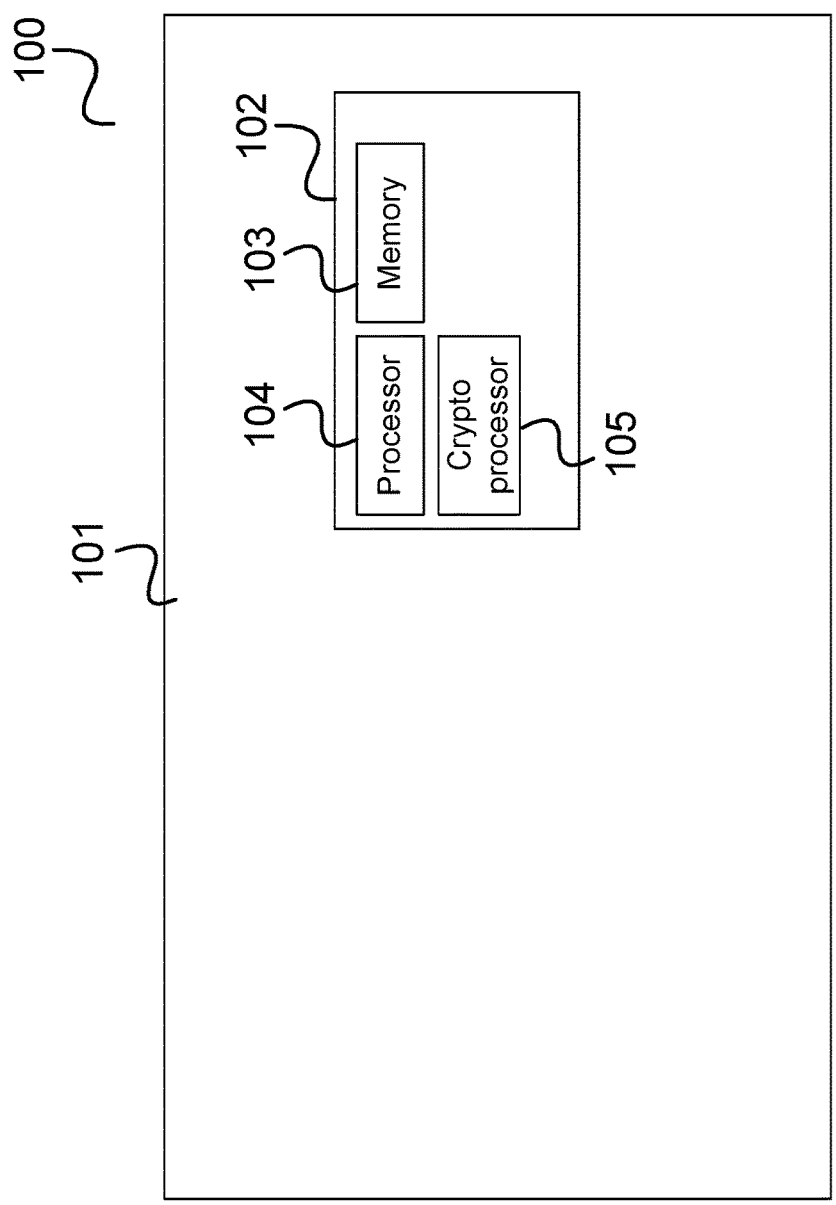
FIG. 1 shows a chip card according to an embodiment.

FIG. 1 shows a chip card 100 according to an embodiment.

The chip card 100 includes a carrier 101 on which a chip card module 102 is arranged. The chip card module 102 includes various data processing components like for example a memory 103, a processor 104 or for example a dedicated crypto processor 105.

It should be noted that a chip card is only an example and the following approaches may be applied to any kind of security chip, i.e. security IC (integrated circuit).

For a security chip, i.e. a chip used in security-related contexts such as the chip card module 102 local integrity protection of data storage elements, like data flip-flops (understood to include latches), is required, including protection against forcing attacks on the storage element's reset and/or scan test inputs, as well as against fault attacks (e.g. by means of ionizing radiation) on the storage element's internal nodes. In addition to that, also protection against forcing attacks on the clock input is conceivable.

Figure 2:
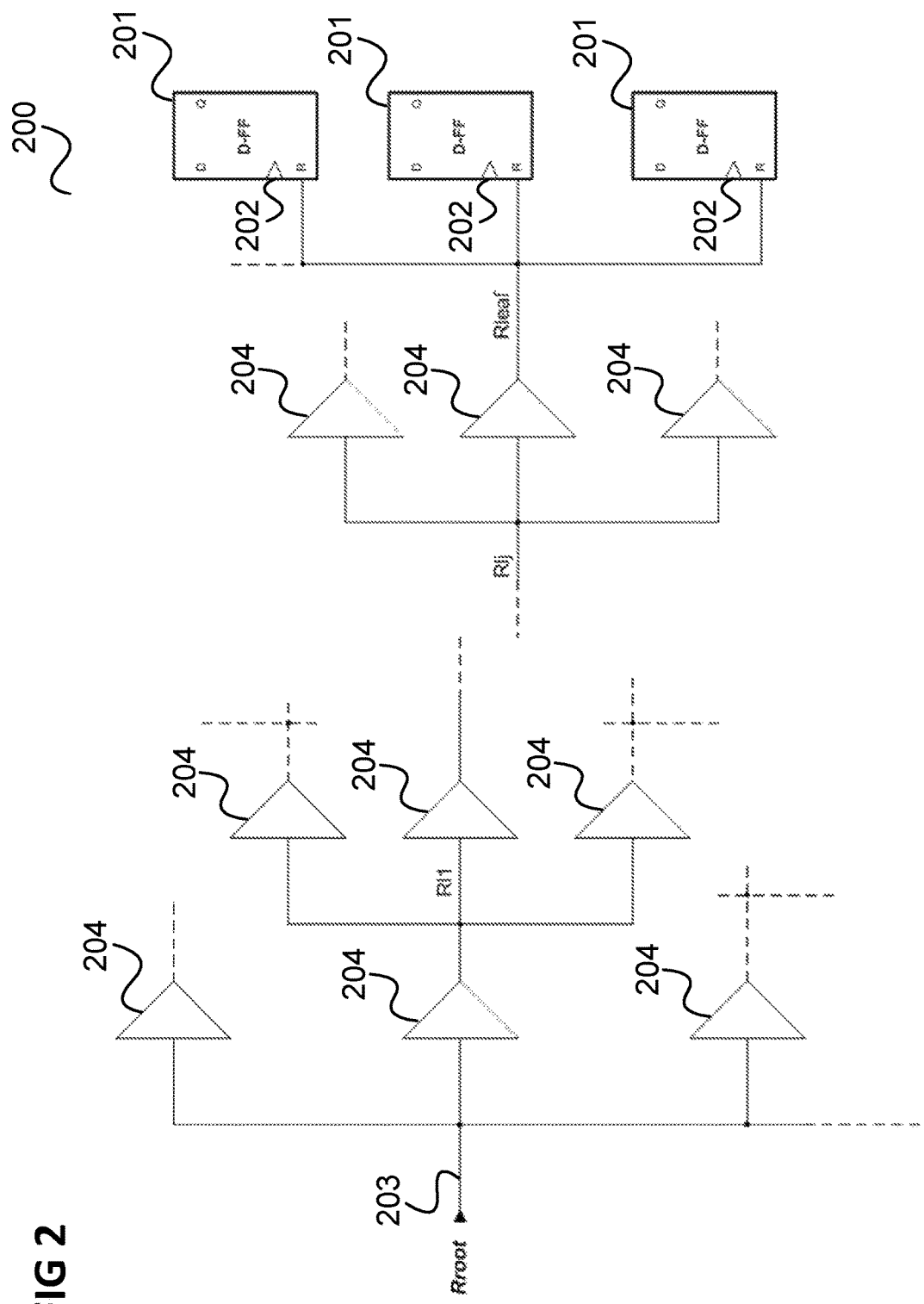
FIG. 2 shows a reset tree structure.

FIG. 2 shows a reset tree structure 200.

The reset tree structure 200 includes a plurality of flip-flops 201 (D-flip-flops in this example) wherein each flip-flop 201 includes a data input D, an output Q, a Reset input and a Clock input 202.

The flip-flops 201 are arranged at the leaf nodes of the reset tree structure 200 (wherein, as illustrated, a plurality of flip-flops may be connected to one leaf node). The root of the reset structure is formed by an input 203 which is supplied with a root reset signal Rroot. The root reset signal Rroot is for example provided by a reset unit (e.g. reset circuit) and may signal a reset such as an alarm reset, a warm reset, a software reset, a hardware reset, a power up reset, a system reset (e.g. for security reasons and/or if system power is too low) etc.

Between the root and the leaves of the reset tree structure 200, buffers 204 are arranged in a tree-like fashion in j+1 levels (n=0 . . . j) wherein the input of the nth level is Rln for n=0 . . . j and the output of jth level (leaf level of the tree) is the signal Rlj+1=Rleaf which is supplied to the reset inputs of the flip-flops 201.

Similar control signals such as a scan test signal, a clock signal etc. may be similarly provided via a tree a chain structure to a plurality flip-flops.

To achieve some degree of integrity protection against forcing attacks on reset and scan test (leaf level) signals on a Security IC, the corresponding signal lines are wired in a secure way (i.e. the wiring is done only in the lowest metal layers and as dense as possible, so that the security critical signals may be considered shielded from above and sidelong). In addition to that, some redundancy may be deployed, i.e. the fan-out of the leaf-level nodes (of, e.g. the reset tree) may be chosen to be smaller than necessary.

Figure 3:
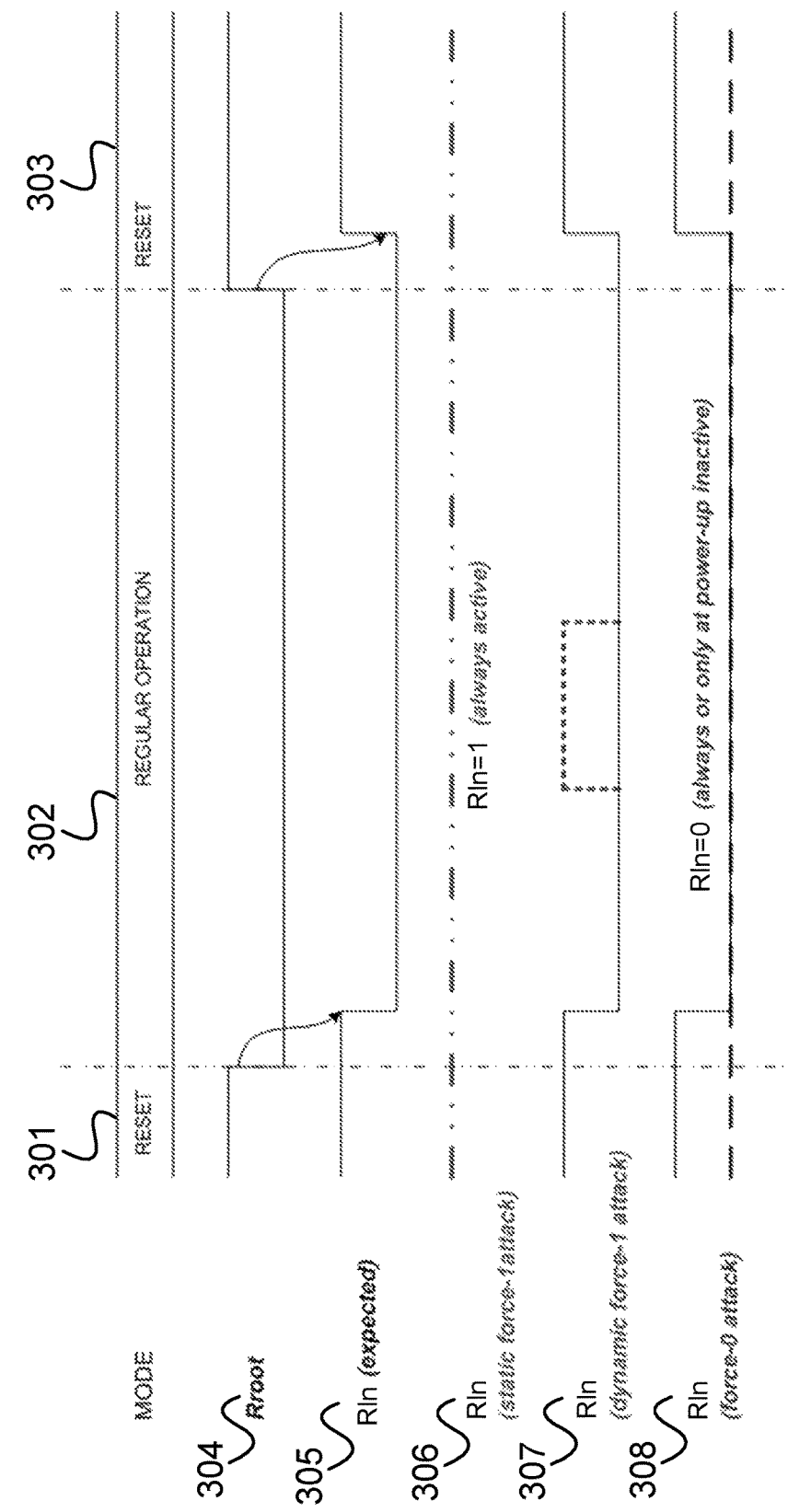
FIG. 3 shows a timing diagram illustrating force attacks on leaf nodes of a reset tree structure.

FIG. 3 shows a timing diagram 300 illustrating force attacks on leaf nodes of a reset tree structure.

In FIG. 3, time flows from left to right. For a first reset 301, a regular operation 302 after the first reset 301, and second reset 303,
- a first graph 304 shows the behavior of the Rroot signal,
- a second graph 305 shows the expected behavior of the Rln signal (wherein n is a number between 1 . . . j+1),
- a third graph 306 shows the behavior of the Rln signal for a static force-1 attack on Rln;
- a fourth graph 307 shows the behavior of the Rln signal for a dynamic force-1 attack on Rln;
- a fifth graph 308 shows the behavior of the Rln signal for a force-0 attack on Rln.

As can be seen, it is assumed that a reset is signaled by means of a high level (e.g. VDD) of a reset signal and normal operation (i.e. no reset) is signaled by a low level (e.g. VSS) of the reset signal. However, this can also be implemented vice versa.

A force 1-attack aims at resetting sequential circuitry (the flip-flops 201 for example) during regular operation and a force-0 attack aims at suppressing the reset signal of resetting sequential circuitry.

In the following, approaches are described for protecting reset and/or reset inputs (or other control inputs) of storage elements against forcing attacks, as well as for protecting against Fault attacks (e.g. by means of ionizing radiation) on the storage elements' internal nodes.

Figure 4:
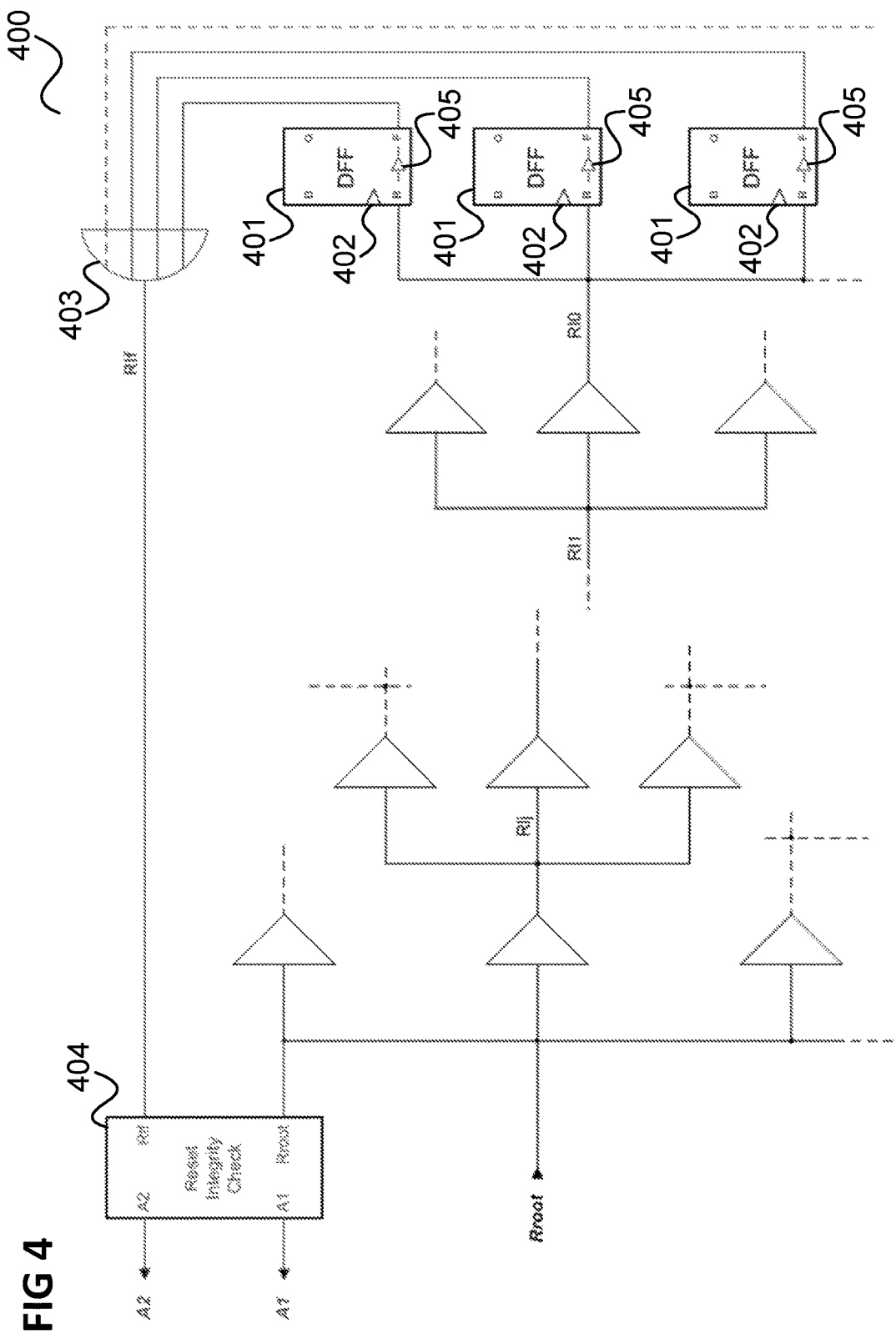
FIG. 4 shows a circuit for protection against force-1 attacks on the reset inputs of a plurality of flip-flops.

FIG. 4 shows a circuit 400 for protection against force-1 attacks on the reset inputs of a plurality of flip-flops.

Similarly to FIG. 1, the circuit 400 includes a reset tree structure having a plurality of flip-flops 401 wherein each flip-flop 401 includes a data input D, an output Q, a reset input and a Clock input 402.

In contrast to FIG. 2, each flip-flop 201 includes a reset feedback output F which outputs the reset signal as it has been received by the flip-flop 201 at its reset input R. For example, the reset input R is connected to the reset feedback output F via a buffer 405.

The reset feedback outputs are connected to circuity 403 being logically equivalent an OR gate (with as many inputs as flip-flops) whose output Rlf is connected to a reset integrity check circuit 404.

The integrity check circuit 404 also receives the Rroot signal (assumed to be 0 for a force-1 attack) and compares the signal Rlf with the Rroot signal and, in case of a mismatch (i.e. any one of the flip-flops 401 has received a 1 at its reset input R), outputs an alarm signal via an alarm output A1.

In addition to the reset signals as output from the flip-flops 401 also other control signals as received by the flip-flops 401 as well as (high active) flip-flop-internal or flip-flop-external FAD (fault attack detection) alarm signals may be OR-connected and fed back to the reset integrity check circuit 404 which may, e.g. using another alarm output A2, output another alarm signal if it receives a FAD alarm signal from one or more of the flip-flops 201 via the OR connection.

Figure 5:
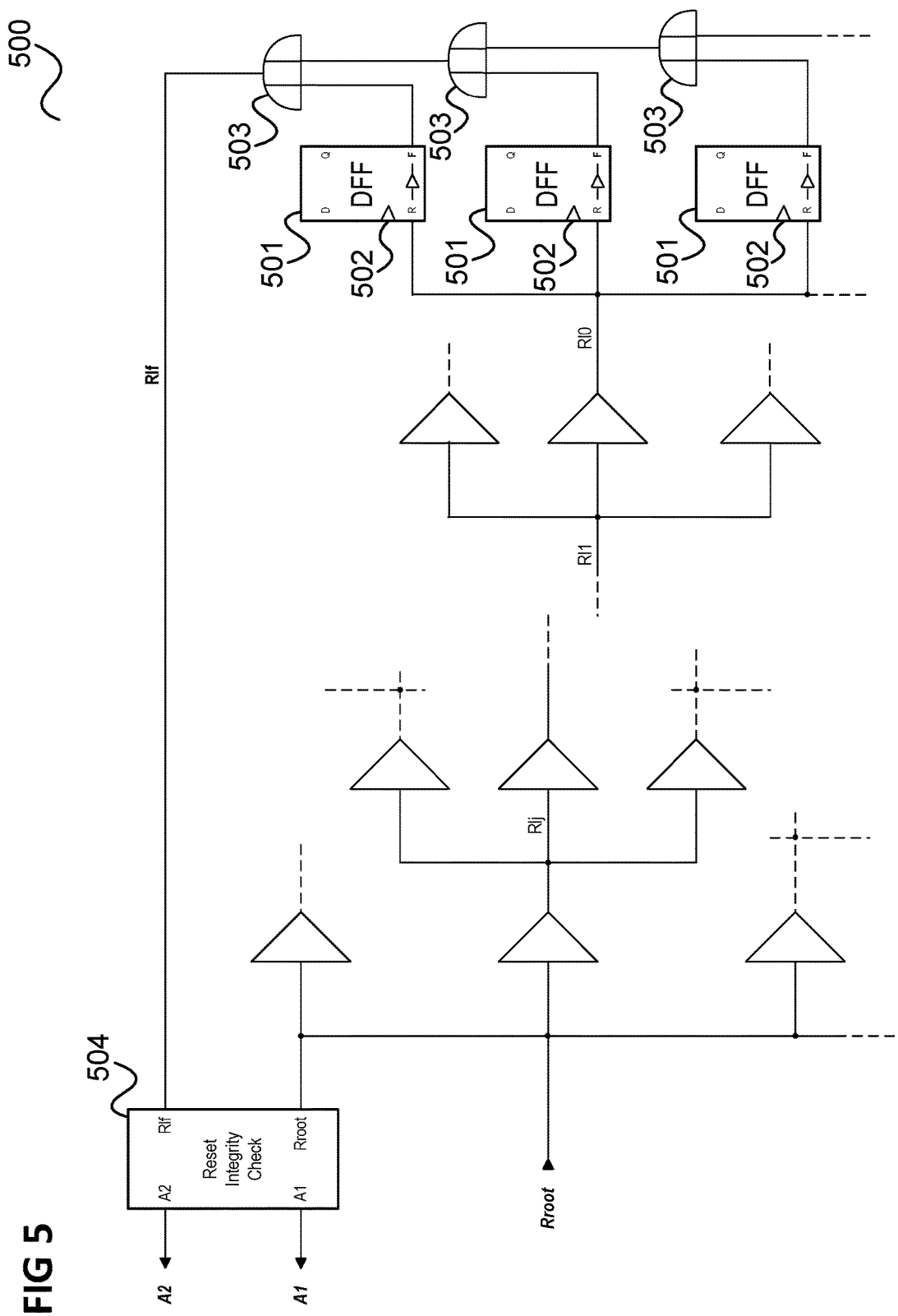
FIG. 5 shows a circuit for protection against force-1 attacks on the reset inputs of a plurality of flip-flops with an alternative feedback of the reset signals.

FIG. 5 shows a circuit 500 for protection against force-1 attacks on the reset inputs of a plurality of flip-flops with an alternative feedback of the reset signals.

Similarly to FIG. 4, the circuit 500 includes a reset tree structure having a plurality of flip-flops 501 wherein each flip-flop 501 includes a data input D, an output Q, a reset input, a clock input 502 and a reset feedback output F.

In contrast to the example of FIG. 4, the circuit includes a two-bit-input OR gate 503 for each flip-flop 501 wherein one input of the OR gate 503 is coupled to the reset feedback output F of the flip-flop 501 and the other input of the OR gate 503 is coupled to the output of the OR gate 503 of a preceding flip-flop (assuming an ordering of the flip-flops 501 such as from bottom to top as illustrated in FIG. 5).

The first flip-flop may not have an OR gate since it does not have preceding flip-flop.

Similarly to FIG. 4, the output of the OR gate 503 of the last (top) flip-flop 501 is fed to a reset integrity check circuit 504.

Figure 6:
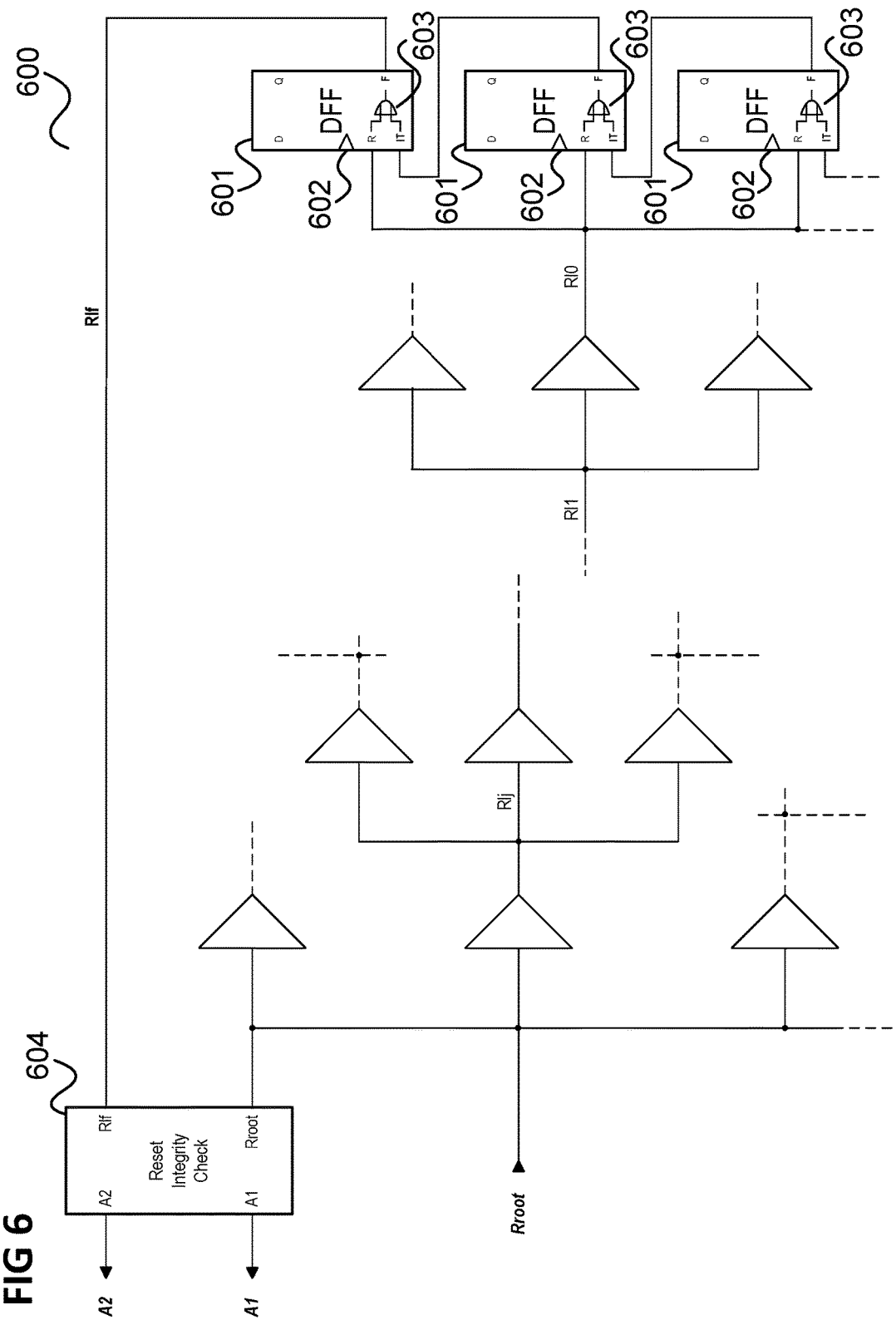
FIG. 6 shows a circuit for protection against force-1 attacks on the reset inputs of a plurality of flip-flops with a further alternative feedback of the reset signals.

The OR gates 503 may also be provided within the flip-flops 501 as illustrated in FIG. 6.

FIG. 6 shows a circuit 600 for protection against force-1 attacks on the reset inputs of a plurality of flip-flops with a further alternative feedback of the reset signals.

Similarly to FIG. 5, the circuit 600 includes a reset tree structure having a plurality of flip-flops 601 wherein each flip-flop 601 includes a data input D, an output Q, a reset input, a clock input 602 and a reset integrity check circuit 604.

However, in contrast to the example of FIG. 5, each flip-flop includes an OR gate 603 and a feedback output F and a feedback input IT, wherein the OR gate 603 receives the reset signal as received by the flip-flop and the feedback signal received from a preceding flip-flop (assuming an ordering of the flip-flops 601 such as from bottom to top as illustrated in FIG. 6) and outputs the result of the OR combination as feedback signal.

The first flip-flop may directly output the reset signal as received (i.e. without combining it with another signal) since it does not have preceding flip-flop.

Similarly to FIG. 5, the feedback signal of the last (top) flip-flop 601 is fed to the reset integrity check circuit 604.

Figure 7:
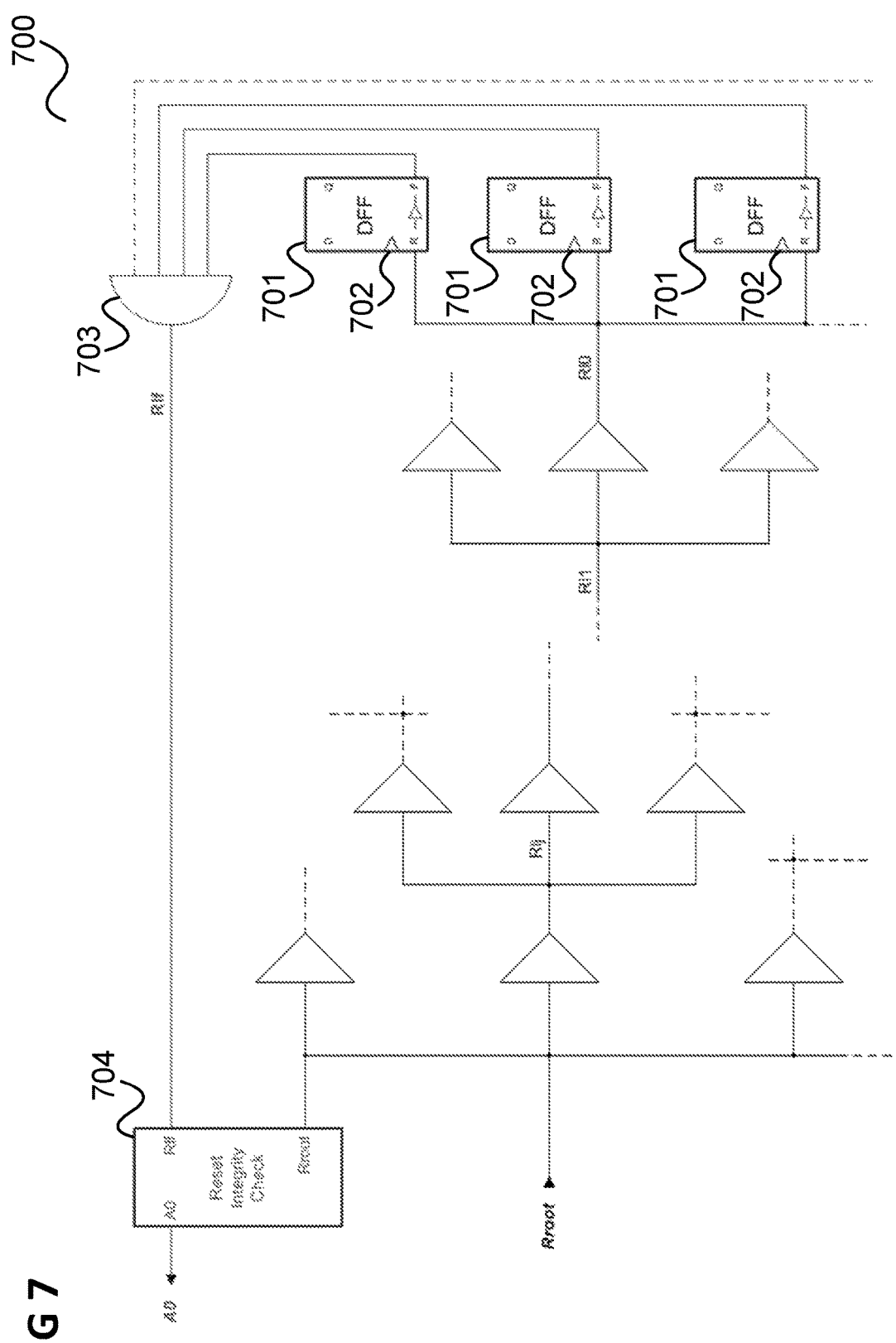
FIG. 7 shows a circuit for protection against force-0 attacks on the reset inputs of a plurality of flip-flops.

FIG. 7 shows a circuit 700 for protection against force-0 attacks on the reset inputs of a plurality of flip-flops.

Similarly to FIG. 4, the circuit 700 includes a reset tree structure having a plurality of flip-flops 701 wherein each flip-flop 701 includes a data input D, an output Q, a reset input, a clock input 702 and a reset feedback output F.

The reset feedback outputs are connected to circuitry 703 being logically equivalent to an AND gate (with as many inputs as flip-flops) whose output Rlf is connected to a reset integrity check circuit 704.

The integrity check circuit 704 also receives the Rroot signal (assumed to be 1 for a force-0 attack) and compares the signal Rlf with the Rroot signal and, in case of a mismatch (i.e. any one of the flip-flops 701 has received a 0 at its reset input R), outputs an alarm signal via an alarm output A0.

Figure 8:
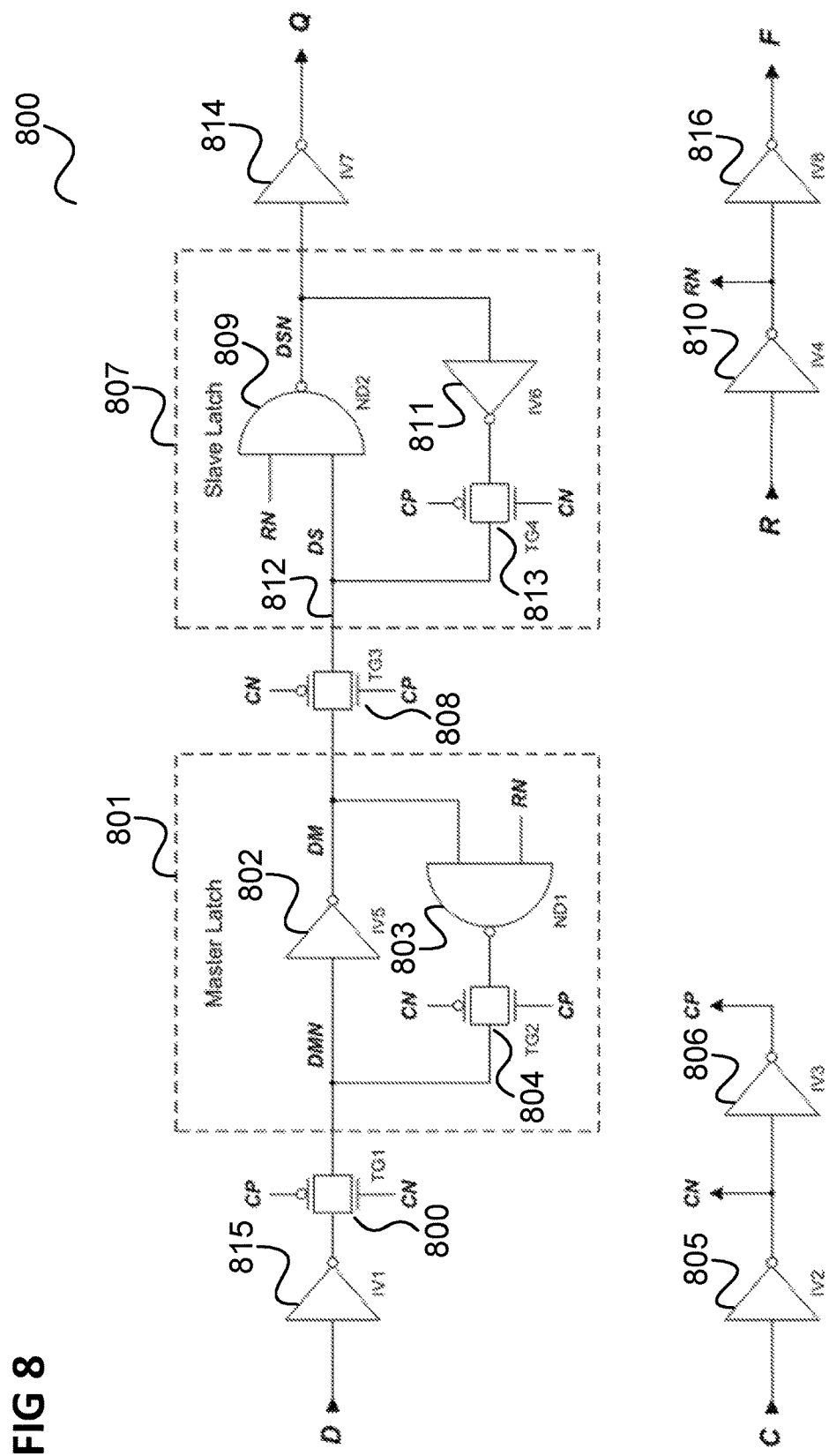
FIG. 8 shows an implementation example for a flip-flop as it may be included in the circuits of FIGS. 4 and 7.

FIG. 8 shows an implementation example for a flip-flop 800 as it may be included in the circuits 400, 500, 700 of FIGS. 4 and 7 as flip-flops 401, 501, 701.

The flip-flop 800 includes a master latch 801 receiving an input DMN which is inverted by a first inverter 802 to generate the master latch's output DM. The master latch 801 further includes a first NAND gate 803 whose inputs are supplied with the output signal DM and the inverted (negative) reset signal RN. The output of the NAND gate 803 is fed back to the first inverter 802 via a first transmission gate 804 whose p channel FET (field effect transistor) is supplied at its gate with the inverted (negative) clock signal CN (generated from the clock signal C by inversion by means of a second inverter 805) and whose n channel FET is supplied at its gate with the positive clock signal CP (generated from the inverted clock signal CN by inversion by means of a third inverter 806).

The output of the master latch 801 is fed to a slave latch 807 by means of a second transmission gate 808 whose p channel FET is supplied at its gate with the inverted clock signal CN and whose n channel FET is supplied at its gate with the positive clock signal CP.

The slave latch 807 includes a second NAND gate 809 which receives the slave latch's input DS and the inverted reset signal RN (generated from the reset signal R by a fourth inverter 810). The output of the second NAND gate 809 is the output DSN of the slave latch 807 and is fed to a fifth inverter 811 of the slave latch 807 whose output is fed back to the slave latch's input node 812 via a third transmission gate 813 whose p channel FET is supplied at its gate with the positive clock signal CP and whose n channel FET is supplied at its gate with the inverted clock signal CN.

The output DSN of the slave latch 807 is fed to a sixth inverter 814 whose output is the flip-flop's output Q.

The flip-flop's input D is received by a seventh inverter 815 whose output is fed as the master latch's input to the master latch 801 via a fourth transmission gate 816 whose p channel FET is supplied at its gate with the positive clock signal CP and whose n channel FET is supplied at its gate with the inverted clock signal CN.

The flip-flop's feedback signal F is generated from the inverted reset signal RN by means of an eighth inverter 816 and thus corresponds to the buffered reset signal R.

Figure 9:
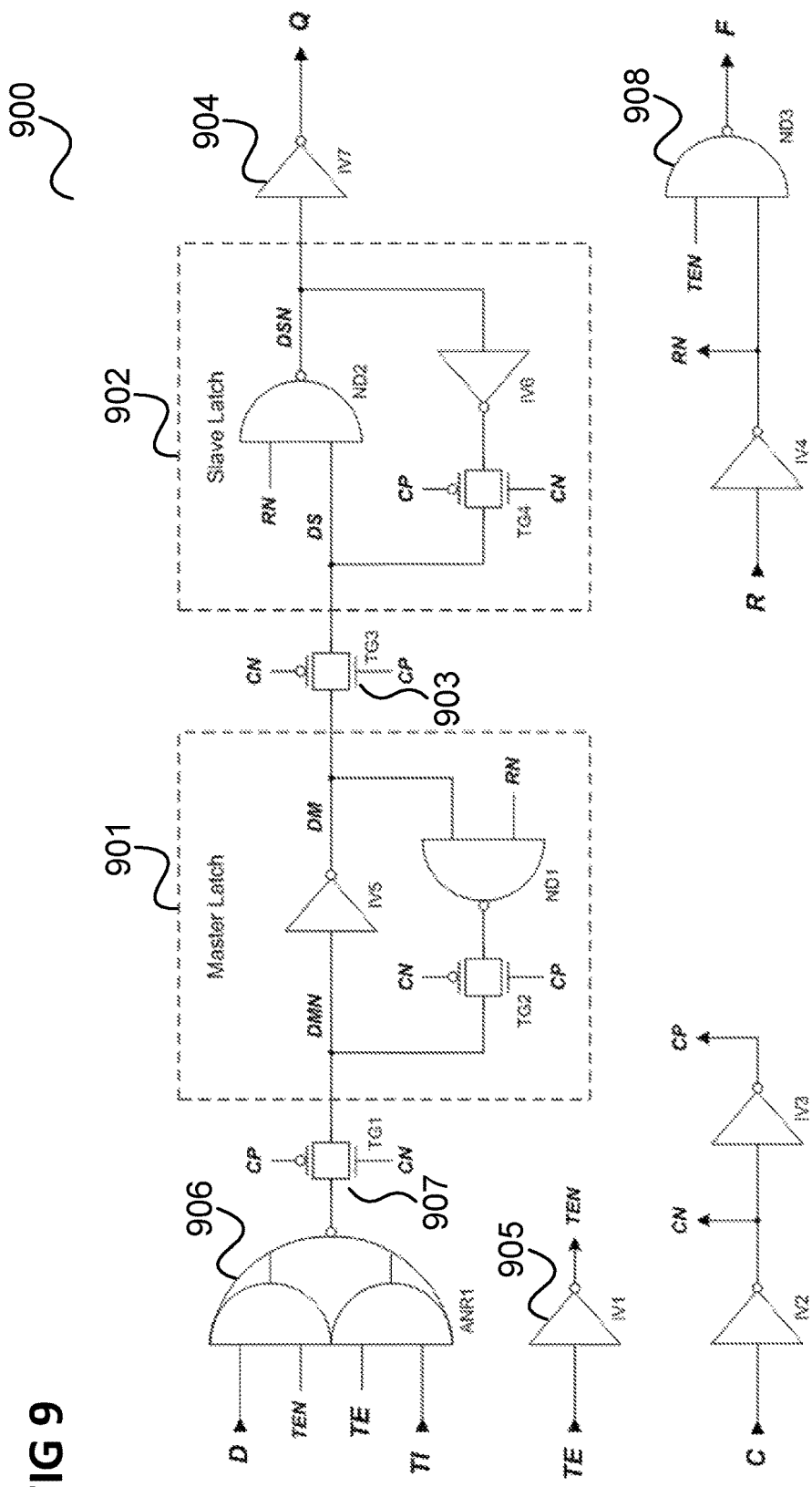
FIG. 9 shows an implementation example for a flip-flop which further includes a scan test enable input and may be used in the circuits of FIGS. 4 and 5 when there is a scan test chain in addition to the reset tree structure.

FIG. 9 shows an implementation example for a flip-flop 900 which further includes a scan test enable input and may be used analogously to the flip-flops 401, 501 when there is a scan test chain in addition to the reset tree structure.

The flip-flop 900 includes a master-latch 901 and a slave latch 902 coupled by a first transmission gate 903 as well as a first inverter 904 at its output as described with reference to FIG. 8.

In this example, the flip-flop's input is fed, together with the inverted test enable signal TEN (generated from the test enable signal TE by means of a second inverter 905) to the AND inputs of a first AND of a Multi-AND-NOR gate 906. A second AND of the Multi-AND-NOR gate 906 is supplied with the test enable signal TE and a test input TI. The results of the AND combinations of the Multi-AND-NOR gate 906 are NOR-combined by the Multi-AND-NOR gate 906 and fed to the master latch as input via a second transmission gate 907 similar to the fourth transmission gate 804.

The flip-flop's feedback signal F (which replaces the reset feedback signal F) is generated by a NAND gate 908 which receives the inverted test enable signal TEN and the inverted reset signal RN.

Thus, the reset integrity check circuit 404, 504 can further detect force-1 attacks on the scan test chain.

Figure 10:
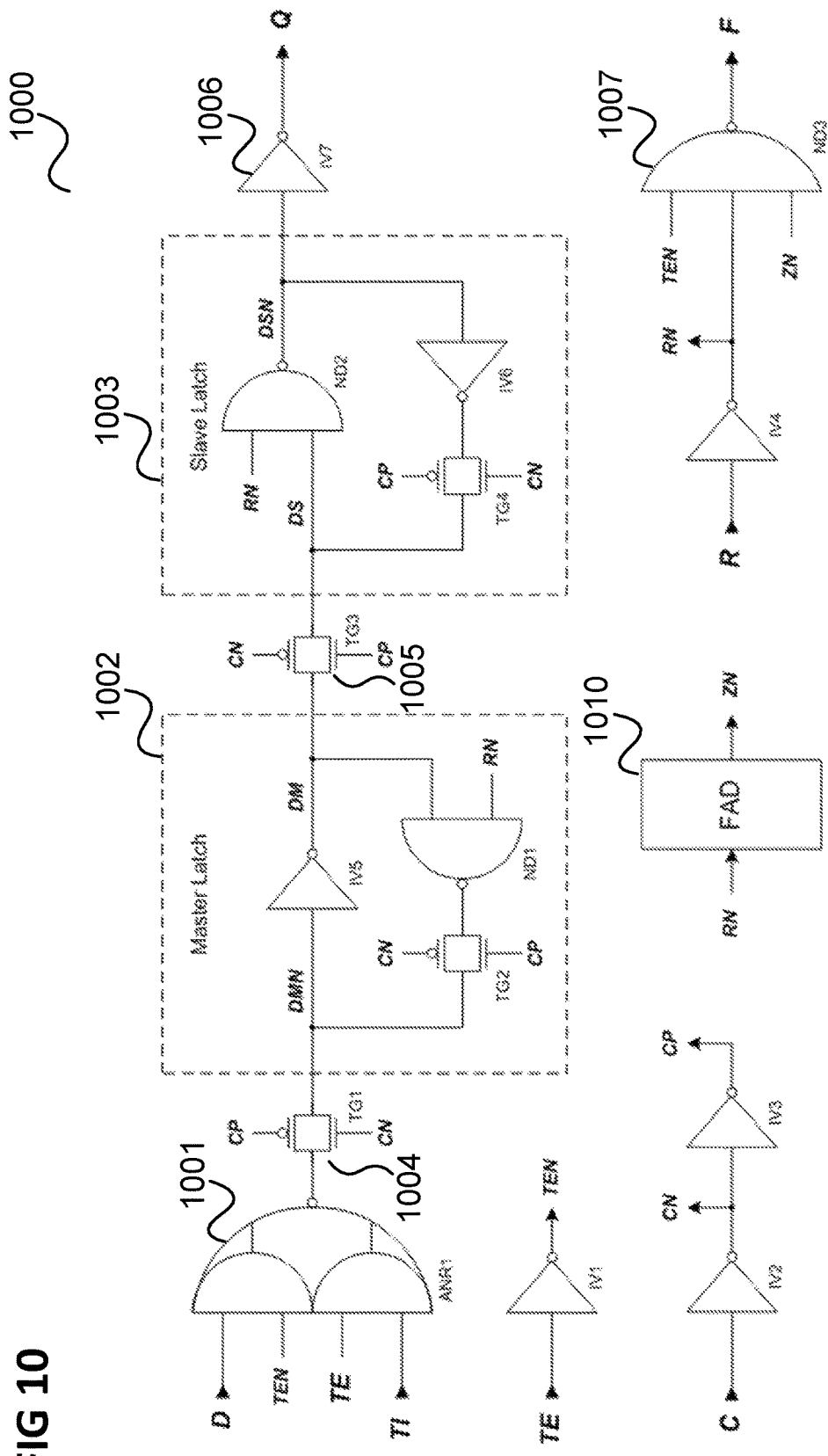
FIG. 10 shows an implementation example for a flip-flop which further includes a fault attack detection sensor and may be used in the circuits of FIGS. 4 and 5 when there is a scan test chain in addition to the reset tree structure.

FIG. 10 shows an implementation example for a flip-flop 1000 which further includes a fault attack detection sensor 1010 and may be used analogously to the flip-flops 401, 501 when there is a scan test chain in addition to the reset tree structure.

The flip-flop 1000 includes a Multi-AND-NOR gate 1001, a master-latch 1002 and a slave latch 1003 coupled by transmission gates 1004, 1005 and an output inverter 1006 as described with reference to FIG. 9.

The fault attack sensor 1010 receives the inverted reset signal RN and its output ZN is 1 for an inactive reset (RN=1) unless there is an attack that flips it into its alarm state ZN=0. The fault attack sensor's output is fed along with the inverted reset signal RN and the inverted scan test enable signal TEN to a 3-input NAND gate 1007 whose output is the flip-flop's feedback signal F.

Thus, the reset integrity check circuit 404, 504 can detect force-1 attacks on the reset tree structure, the scan test chain as well as fault attacks on the flip-flop.

Figure 11:
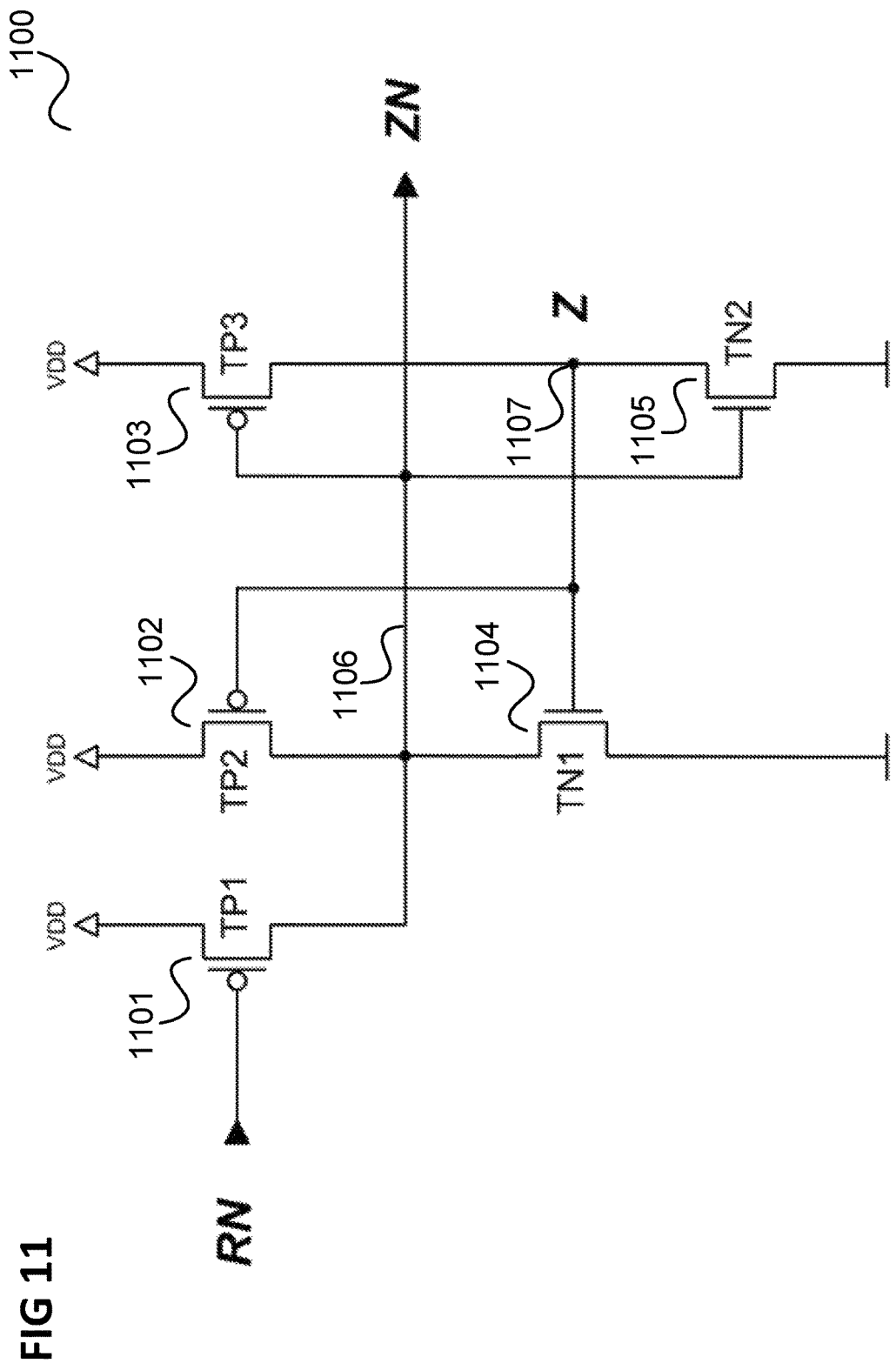
FIG. 11 shows an example for a fault error detection (FAD) circuit.

FIG. 11 shows an example for a fault error detection (FAD) circuit 1100.

The FAD circuit 1100 includes a first p channel FET 1101 whose source is connected to the high supply potential (VDD), whose gate is supplied with the inverted reset signal RN and whose drain is connected to the FAD circuits' output node 1106 (outputting the signal ZN). The FAD circuit 1100 further includes a second p channel FET 1102 whose source is connected to the high supply potential, whose gate is connected to an internal node 1107 with state Z and whose drain is connected to the output node 1106 and further includes a third p channel FET 1103 whose source is connected to the high supply potential, whose gate is connected to the output node 1006 and whose drain is connected to the internal node 1107.

The FAD circuit 1100 further includes a first n channel FET 1104 whose source is connected to a low supply potential (ground or VSS), whose gate is connected to the internal node 1107 and whose drain is connected to the output node 1006. Further, the FAD circuit 1100 includes a second n channel FET 1105 whose source is connected to the low supply potential, whose gate is connected to the output node 1106 and whose drain is connected to the internal node 1107.

For an active reset signal (RN=0) ZN is forced to 1 (and Z to 0) and remains in this state also after the reset signal is set to inactive (RN=1), unless there is an attack that flips the FAD circuit 1100 to its alarm state (ZN, Z)=(0, 1). The FAD circuit's particular sensitivity against fault attacks may be achieved by proper dimensioning of the FETs 1101-1105 (e.g. MOS Metal Oxide Semiconductor) transistors. For example, the first n channel FET 1104 and the third p channel FET 1103 may be set to a high driver strength and the second n channel FET 1105 and the second p channel FET 1102 to a low driver strength by choosing appropriate channel lengths and widths as well as threshold voltages.

It should be noted that the integration of an FAD circuit as for example with reference to FIG. 11 automatically provides protection against suppressing the reset signal since the FAD circuit assumes its alarm state with power-up unless the reset signal is active.

A further possible generalization consists in feeding back the clock signals, i.e. CN in addition to or instead of RN, TEN and ZN.

Figure 12:
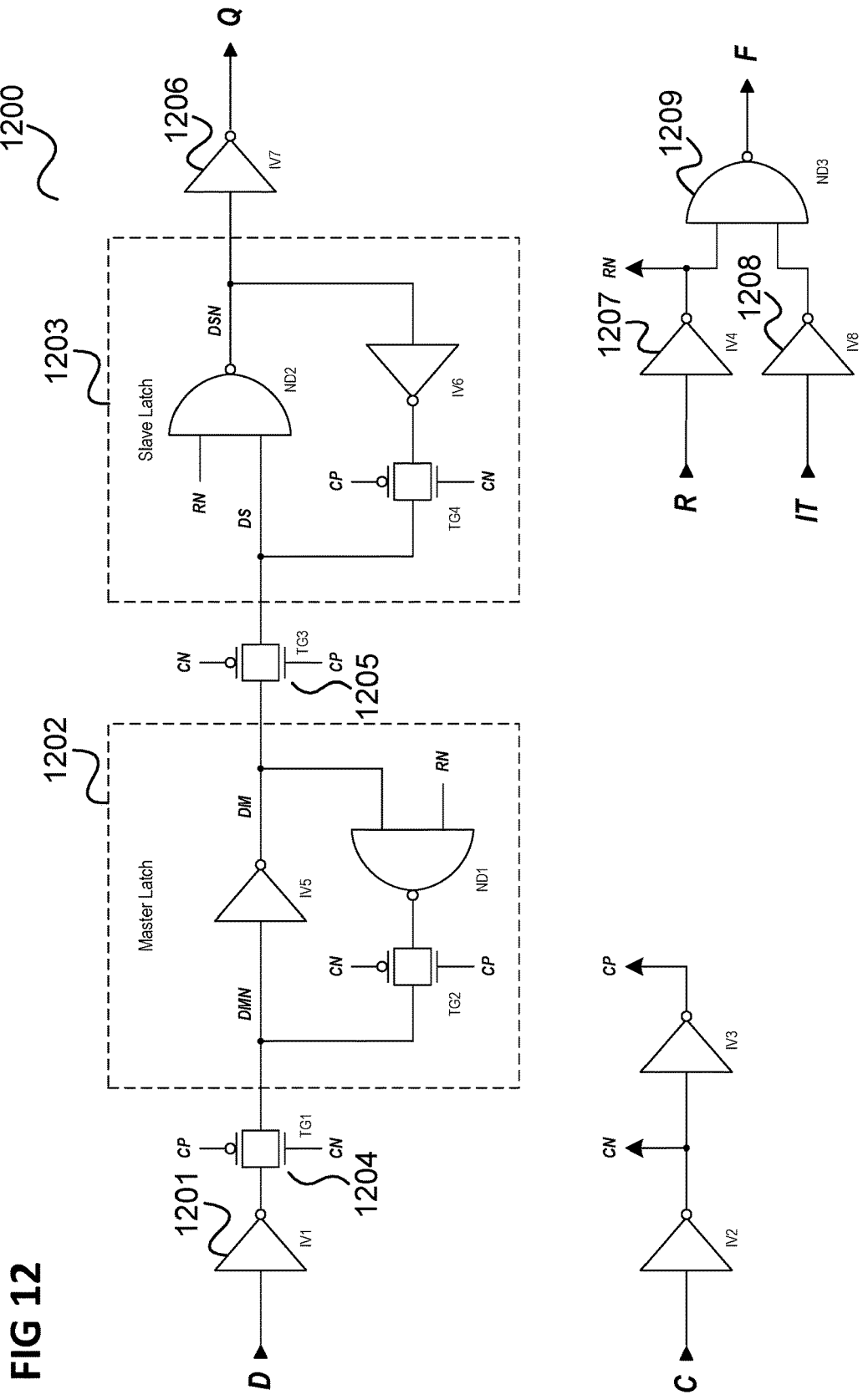
FIG. 12 shows an implementation example for a flip-flop as it may be included in the circuit of FIG. 6.

FIG. 12 shows an implementation example for a flip-flop 1200 as it may be included in the circuit 600 of FIG. 6 as flip-flops 601.

Similarly to FIG. 8, the flip-flop 1200 includes a first inverter 1201, a master latch 1202, a slave latch 1203 coupled by transmission gates 1204, 1205 and includes a second inverter 1206.

The OR combination of the reset signal R and the feedback signal of the preceding flip-flop is achieved by a third inverter 1207 which inverts the reset signal R to RN and a fourth inverter 1208 which inverts the feedback signal from the preceding flip-flop and a NAND combination of the outputs of the third inverter 1207 and the fourth inverter 1208 by means of a NAND gate 1209 whose output signal is the flip-flops feedback signal.

Figure 13:
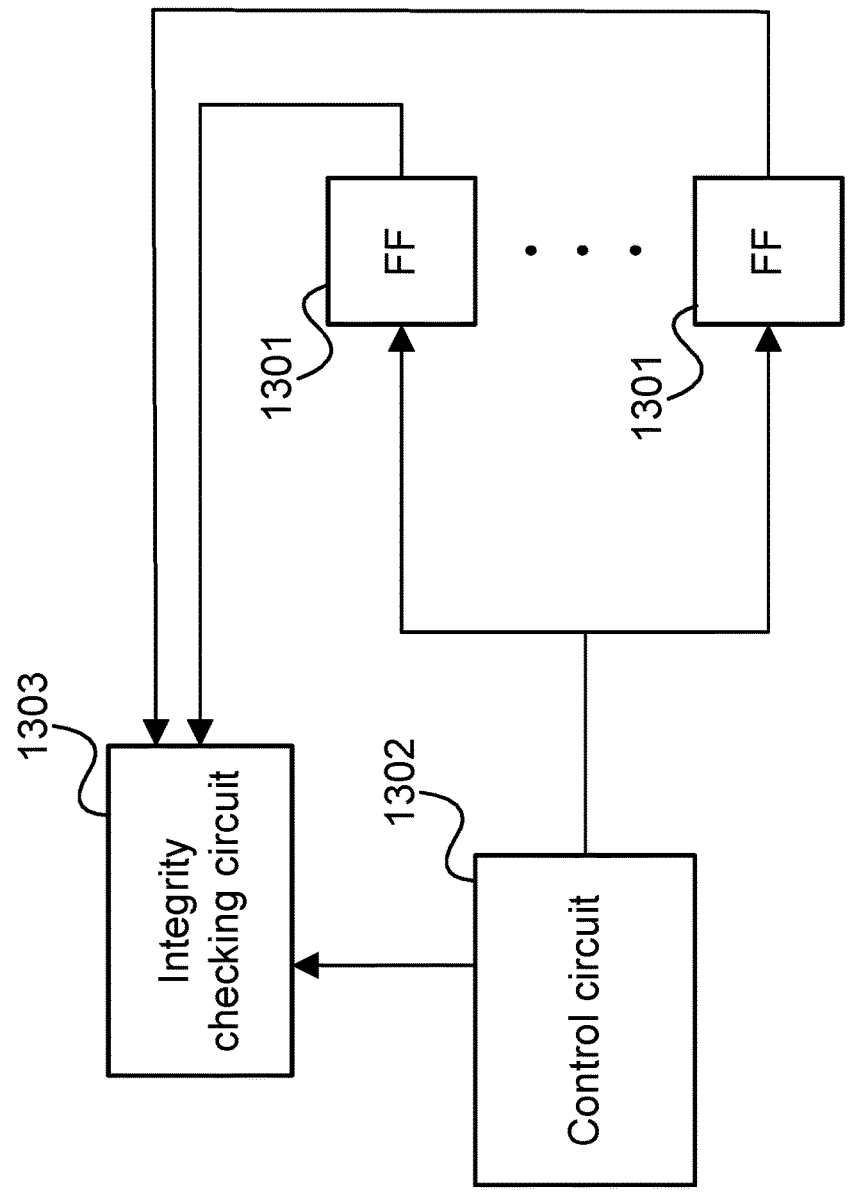
FIG. 13 shows a circuit.

In summary, according to various embodiments, a circuit as illustrated in FIG. 13 is provided.

FIG. 13 shows a circuit 1300.

The circuit 1300 includes a plurality of flip-flops 1301 and a control circuit 1302 configured to provide a control signal to each flip-flop of the plurality of flip-flops 1301.

The circuit 1300 further includes an integrity checking circuit 1303 connected to the control circuit 1302 and to the plurality of flip-flops 1301 configured to check whether the flip-flops 1301 receive the control signal as provided by the control circuit 1302.

According to various embodiments, in other words, a control signal as it is received by a plurality of flip-flops is fed back for checking whether the flip-flops have received the control signal as intended or whether, for example, the control signal has been changed by an attack (e.g. a force-1 or a force-0 attack).

It should be noted that the term "flip-flop" is understood to include a latch.

According to various embodiments, different protection/detection measures are integrated within a storage element itself and by providing a single feedback signal that indicates improper reset or test enable or clock timing conditions or indicates a detected fault attack.

Figure 14:
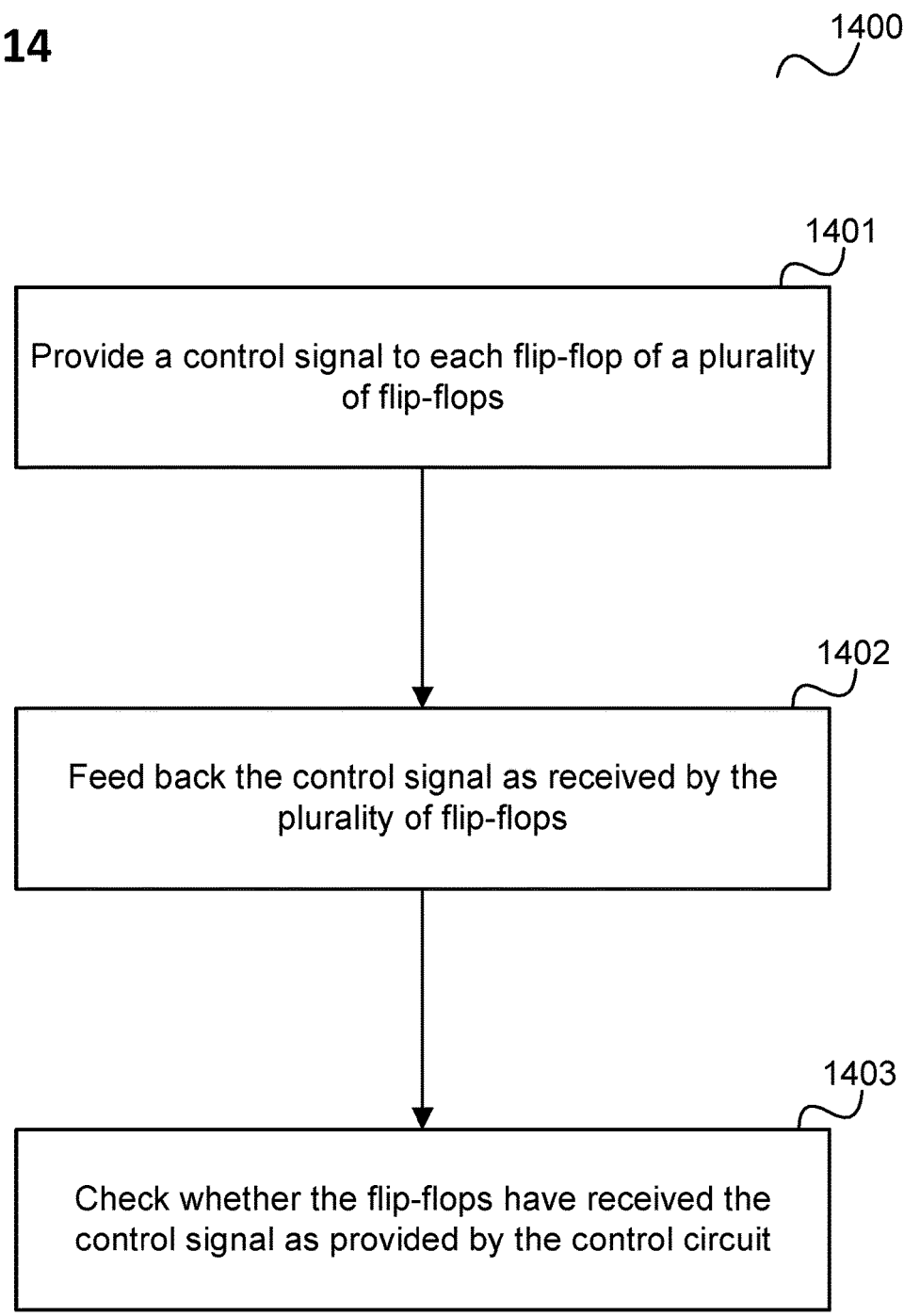
FIG. 14 shows a flow diagram illustrating a method for checking the integrity of a control signal.

The circuit 1300 for example carries out a method as illustrated in FIG. 14.

FIG. 14 shows a flow diagram 1400 illustrating a method for checking the integrity of a control signal.

In 1401, a control signal is provided to each flip-flop of a plurality of flip-flops.

In 1402, the control signal is fed back as received by the plurality of flip-flops;

In 1403, it is checked whether the flip-flops have received the control signal as provided by the control circuit.

Various examples are described below:

Example 1 is a circuit as described with reference to FIG. 13.

Example 2 is the circuit of Example 1, wherein the integrity checking circuit is configured to initiate an alarm procedure in case one or more of the flip-flops do not receive the control signal as provided by the control circuit.

Example 3 is the circuit of Example 1 or 2, wherein the control signal is a reset signal or a test enable signal.

Example 4 is the circuit of any one of Examples 1 to 3, wherein the flip-flop has a detector configured to detect an attack and configured to activate an alarm signal in response of an attack.

Example 5 is the circuit of Example 4, wherein each flip-flop outputs a feedback based on the control signal and the alarm signal.

Example 6 is the circuit of Example 4, wherein each flip-flop circuit has an output circuit configured to output the control signal as received by the flip-flop and wherein the output circuit is switchable to output the alarm signal generated by the flip-flop.

Example 7 is the circuit of any one of Examples 4 to 6, wherein the integrity checking circuit is configured to initiate an alarm procedure in response to the activation of the alarm signal of one of the flip-flops.

Example 8 is the circuit of any one of Examples 1 to 7, comprising a feedback circuit wherein the integrity checking circuit is connected to the plurality of flip-flops via the feedback circuit.

Example 9 is the circuit of any one of Examples 1 to 8, wherein each flip-flop outputs a feedback signal based on the control signal it has received Example 10 is the circuit of Example 9, wherein the integrity checking circuit is a comparator configured to compare the feedback signals with the control signal as provided by the control circuit.

Example 11 is the circuit of Example 9, wherein the integrity checking circuit is connected to the flip-flops to receive a combination of the feedback signals.

Example 12 is the circuit of Example 11, wherein the integrity checking circuit is a comparator configured to compare the combination of the feedback signals with the control signal as provided by the control circuit.

Example 13 is the circuit of any one of Examples 1 to 12, wherein the integrity checking circuit is connected to the plurality of flip-flops to receive an OR combination of the control signals received by the flip-flops and the integrity checking circuit is configured to check whether any one of the flip-flops has received the control signal as high when the control circuit has provided the control signal as low.

Example 14 is the circuit of any one of Examples 1 to 13, wherein the control signal is an active high signal and the integrity checking circuit is connected to the plurality of flip-flops to receive an AND combination of the control signals received by the flip-flops and the integrity checking circuit is configured to check whether any one of the flip-flops has received the control signal as low when the control circuit has provided the control signal as high.

Example 15 is the circuit of any one of Examples 1 to 14, further comprising a second control circuit configured to provide a second control signal to each flip-flop of the plurality of flip-flops Example 16 is the circuit of Example 15, wherein the integrity checking circuit is configured to check whether the flip-flops receive the control signal as provided by the control circuit and whether the flip-flops receive the second control signal as provided by the second control circuit.

Example 17 is the circuit of Example 15 or 16, wherein each flip-flop outputs a feedback based on the control signal it has received and the second control it has received.

Example 18 is the circuit of Examples 17, wherein the integrity checking circuit is connected to the flip-flops to receive a combination of the feedback signals and is configured to check whether the flip-flops receive the control signal as provided by the control circuit and whether the flip-flops receive the second control signal as provided by the second control circuit based on the combination.

Example 19 is the circuit of any one of Examples 1 to 18, wherein the control signal and the second control signal are a reset signal and a test enable signal.

Example 20 is a method for checking the integrity of a control signal as described with reference to FIG. 14.

According to a further example a circuit is described including a plurality of flip-flops, wherein each flip-flop is provided with a control signal, a feedback circuit configured to feed back the control signal received from the flip-flops and a checking circuit configured to check whether the fed back control signals have an intended value.

It should be noted that examples and features described in context of one of the circuits is analogously valid for the other circuit and the method for checking the integrity of a control signal and vice versa.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes which come within the meaning and range of equivalency of the claims are therefore intended to be embraced.

What is claimed is:

1. A circuit comprising:
    a plurality of flip-flops, each of the flip-flops comprising a data input, a reset input,
    a clock input, a data output, and a reset feedback output,
    a control circuit configured to provide a control signal to the reset input of each flip-flop of the plurality of flip-flops, wherein each of the plurality of flip-flops is configured to receive at the reset input the control signal and further configured to output at the reset feedback output a feedback signal based on a signal received at the reset input, and
    an integrity checking circuit connected to the control circuit and to the plurality of flip-flops configured to check whether the flip-flops receive the control signal as provided by the control circuit.

2. The circuit of claim 1, wherein the integrity checking circuit is configured to initiate an alarm procedure in case one or more of the flip-flops do not receive the control signal as provided by the control circuit.

3. The circuit of claim 1, wherein the control signal is a reset signal or a test enable signal.

4. The circuit of claim 1, wherein the flip-flop has a detector configured to detect an attack and configured to activate an alarm signal in response of an attack.

5. The circuit of claim 4, wherein each flip-flop outputs a feedback based on the control signal and the alarm signal.

6. The circuit of claim 4, wherein each flip-flop circuit has an output circuit configured to output the control signal as received by the flip-flop and wherein the output circuit is switchable to output the alarm signal generated by the flip-flop.

7. The circuit of claim 4, wherein the integrity checking circuit is configured to initiate an alarm procedure in response to the activation of the alarm signal of one of the flip-flops.

8. The circuit of claim 1, further comprising a feedback circuit wherein the integrity checking circuit is connected to the plurality of flip-flops via the feedback circuit.

9. The circuit of claim 1, wherein the integrity checking circuit is a comparator configured to compare the feedback signals with the control signal as provided by the control circuit.

10. The circuit of claim 1, wherein the integrity checking circuit is connected to the flip-flops to receive a combination of the feedback signals.

11. The circuit of claim 10, wherein the integrity checking circuit is a comparator configured to compare the combination of the feedback signals with the control signal as provided by the control circuit.

12. The circuit of claim 1, wherein the integrity checking circuit is connected to the plurality of flip-flops to receive an OR combination of the control signals received by the flip-flops and the integrity checking circuit is configured to check whether any one of the flip-flops has received the control signal as high when the control circuit has provided the control signal as low.

13. The circuit of claim 1, wherein the control signal is an active high signal and the integrity checking circuit is connected to the plurality of flip-flops to receive an AND combination of the control signals received by the flip-flops and the integrity checking circuit is configured to check whether any one of the flip-flops has received the control signal as low when the control circuit has provided the control signal as high.

14. The circuit of claim 1, further comprising a second control circuit configured to provide a second control signal to each flip-flop of the plurality of flip-flops.

15. The circuit of claim 14, wherein the integrity checking circuit is configured to check whether the flip-flops receive the control signal as provided by the control circuit and whether the flip-flops receive the second control signal as provided by the second control circuit.

16. The circuit of claim 14, wherein each flip-flop outputs a feedback based on the control signal it has received and the second control signal it has received.

17. The circuit of claim 16, wherein the integrity checking circuit is connected to the flip-flops to receive a combination of the feedback signals and is configured to check whether the flip-flops receive the control signal as provided by the control circuit and whether the flip-flops receive the second control signal as provided by the second control circuit based on the combination.

18. The circuit of claim 14, wherein the control signal and the second control signal are a reset signal and a test enable signal.

19. The circuit of claim 1, wherein the integrity checking circuit is directly connected to the control circuit, and wherein each reset input of the plurality of flip-flops is connected to the reset feedback output via a buffer.

20. A circuit comprising:
    a plurality of flip-flops;
    a control circuit configured to provide a control signal to each flip-flop of the plurality of flip-flops; wherein each flip-flop outputs a feedback signal based on the control signal it has received; and
    an integrity checking circuit connected to the control circuit and to the plurality of flip-flops configured to check whether the flip-flops receive the control signal as provided by the control circuit, wherein the integrity checking circuit is a comparator configured to compare the feedback signals with the control signal as provided by the control circuit.

* * * * *